(12) United States Patent
Cho

(10) Patent No.: US 6,306,666 B1
(45) Date of Patent: Oct. 23, 2001

(54) METHOD FOR FABRICATING FERROELECTRIC MEMORY DEVICE

(75) Inventor: Ho Jin Cho, Kyoungki-do (KR)

(73) Assignee: Hyundai Electronics Co., Ltd., Kyoungki-do (KR)

(*) Notice: Subject to any disclaimer, the term of this patent is extended or adjusted under 35 U.S.C. 154(b) by 0 days.

(21) Appl. No.: 09/461,844

(22) Filed: Dec. 15, 1999

(30) Foreign Application Priority Data

Dec. 29, 1998 (KR) .................................................. 98-59976

(51) Int. Cl.[7] .................................................... H01G 7/06
(52) U.S. Cl. .................................................... 438/3; 438/240
(58) Field of Search ........................................ 438/3, 240

(56) References Cited

U.S. PATENT DOCUMENTS

| 5,489,548 | 2/1996 | Nishioka et al. | 437/60 |
|---|---|---|---|
| 5,554,564 | 9/1996 | Nishioka et al. | 437/192 |
| 5,554,866 | 9/1996 | Nishioka et al. | 257/295 |
| 5,609,927 | * 3/1997 | Summerfelt et al. | 427/553 |
| 5,638,319 | * 6/1997 | Onishi et al. | 365/145 |
| 5,729,054 | * 3/1998 | Summerfelt et al. | 257/751 |
| 5,796,134 | 8/1998 | Kim | 257/295 |
| 5,902,131 | 5/1999 | Argos et al. | 438/618 |
| 5,994,153 | * 11/1999 | Nagel et al. | 438/3 |
| 6,180,482 | * 1/2001 | Kang | 438/396 |

FOREIGN PATENT DOCUMENTS

| 09082909 | 3/1997 | (JP) | H01L/27/108 |
|---|---|---|---|
| 09162362 | 6/1997 | (JP) | H01L/27/10 |
| 09232532 | 9/1997 | (JP) | H01L/27/108 |

* cited by examiner

*Primary Examiner*—Jey Tsai
(74) *Attorney, Agent, or Firm*—Finnegan, Henderson, Farabow, Garrett & Dunner, L.L.P.

(57) ABSTRACT

The present invention provides a method for fabricating a ferroelectric memory device capable of preventing formation of an oxide layer between a BST layer and a storage node electrode with using a general electrode that is easy to etch, as a storage node electrode.

The method comprises the steps of: forming successively a barrier layer and a metal layer for storage node electrode on the intermetal insulating layer; forming a storage node electrode by patterning the metal layer for storage node electrode and the barrier layer to be contact with the contact plug; depositing a ferroelectric layer on the storage node electrode and the intermetal insulating layer at a temperature that the storage node electrode is not oxidized; crystallizing the ferroelectric layer; and forming a plate electrode on the ferroelectric layer, wherein the ferroelectric layer is deposited at temperature of 100~400° C. according to the MOCVD method.

9 Claims, 3 Drawing Sheets

METHOD FOR FABRICATING FERROELECTRIC MEMORY DEVICE

FIELD OF THE INVENTION

This invention relates to a method for fabricating a semiconductor memory device, and more particularly to a method for fabricating a semiconductor memory device using a ferroelectric layer as a capacitor insulating layer.

BACKGROUND OF THE INVENTION

Together with recent development of semiconductor manufacturing technology, demand of memory device had been increased rapidly. Therefore, high capacitance within small dimension of device is required. Capacitance of a capacitor is in proportion to dielectric constant of a dielectric and is reverse proportion thickness of the dielectric. As the device is highly integrated, in order to optimize the capacitance, there have been suggested various methods such as a method using an insulator having high dielectric constant as a capacitor insulating layer; a method enlarging dimension of electrode and a method reducing thickness of the dielectric. To provide such high capacitance, $SiO_2/Si_3N_4$ or $Ta_2O_5$ has been used as dielectrics. To enlarge dimension of electrode, a three dimensional structure such as a stack type or a trench type in a planar capacitor cell has been suggested.

However, conventional dielectrics such as $SiO_2/Si_3N_4$ or $Ta_2O_5$ can not be applied any more as a capacitor insulating layer to highly integrated memory devices over 1 Gbit. Then, recently BST having high dielectric constant is suggested as noticeable dielectrics, and studies thereof have also been in progress.

One of ferroelectric layers, the BST layer is deposited under oxygen atmosphere at temperature of over 400° C., therefore a native oxide layer having lower dielectric constant may be formed at an interface between a polysilicon, i.e. a storage node and the BST layer. To prevent formation of the native oxide layer, instead using the polysilicon, materials having excellent antioxidation property such as noble metals for example platinum(Pt), iridium(Ir), ruthenium(Pu) or oxide electrodes for example $RuO_2$, $IrO_2$ can be used as a storage node electrode.

Platinum, iridium and ruthenium used as the storage node electrode are chemically stabilized materials. However, an angle made by an etching plane and a substrate plane is below 75 degrees, therefore the etching plane is inclined with respect to the substrate plane since the steam pressure of by-products made in the etching process. Thus, it is difficult to form the storage node electrode having distance below 0.18 µm by the material comprising platinum(Pt), iridium(Ir), ruthenium(Ru) or oxide electrodes for example $RuO_2$, $IrO_2$.

On the other hand, general metals such as tungsten (W), tungsten nitride(WN), tantalum(Ta), tantalum nitride(TaN), titanium(Ti) and titanium nitride(TiN) are easy to etch compared to the noble metals, however their antioxidation property is not very good. Accordingly, there is formed an oxide layer on the general metal layer after a ferroelectric layer is formed, thereby increasing thickness of a dielectric and also increasing leakage current.

SUMMARY OF THE INVENTION

Therefore, the object of the present invention is to provide a method for fabricating a ferroelectric memory device capable of preventing formation of an oxide layer between a BST layer and a storage node electrode with using a general electrode that is easy to etch, as a storage node electrode.

To accomplish the foregoing object, the present invention provides a method for fabricating a ferroelectric memory device comprising the steps of: forming an intermetal insulating layer provided with a contact hole exposing a junction region formed on a semiconductor layer having the junction region; forming a contact plug within the contact hole; forming successively a barrier layer and a metal layer for storage node electrode on the intermetal insulating layer; forming a storage node electrode by patterning the metal layer for storage node electrode and the barrier layer to be contact with the contact plug; forming a ferroelectric layer on a semiconductor substrate in which a lower electrode is formed; and forming a plate electrode on the ferroelectric layer, wherein the step of forming the ferroelectric layer further comprises the steps of: depositing the ferroelectric layer at temperature that the storage node electrode is not oxidized; and crystallizing the ferroelectric layer.

The present invention further comprise a method for fabricating a ferroelectric memory device comprising the steps of: forming an intermetal insulating layer provided with a contact hole exposing a junction region formed on a semiconductor layer having the junction region; forming a contact plug within the contact hole; forming successively a barrier layer and a metal layer for storage node electrode on the intermetal insulating layer; forming a storage node electrode by patterning the metal layer for storage node electrode and the barrier layer to be contact with the contact plug; depositing a ferroelectric layer on the storage node electrode and the intermetal insulating layer at a temperature that the storage node electrode is not oxidized; crystallizing the ferroelectric layer; and forming a plate electrode on the ferroelectric layer, wherein the storage node electrode is selected from tungsten(W), tungsten nitride(WN), tantalum (Ta), tantalum nitride (TaN), titanium(Ti) and titanium nitride (TiN), wherein the ferroelectric layer is deposited at temperature of 100–400° C. according to the MOCVD method.

DETAILED DESCRIPTION OF THE PREFERRED EMBODIMENTS

Hereinafter, the preferred embodiment of the present invention will be described with reference to accompanying drawings.

Figure 1:
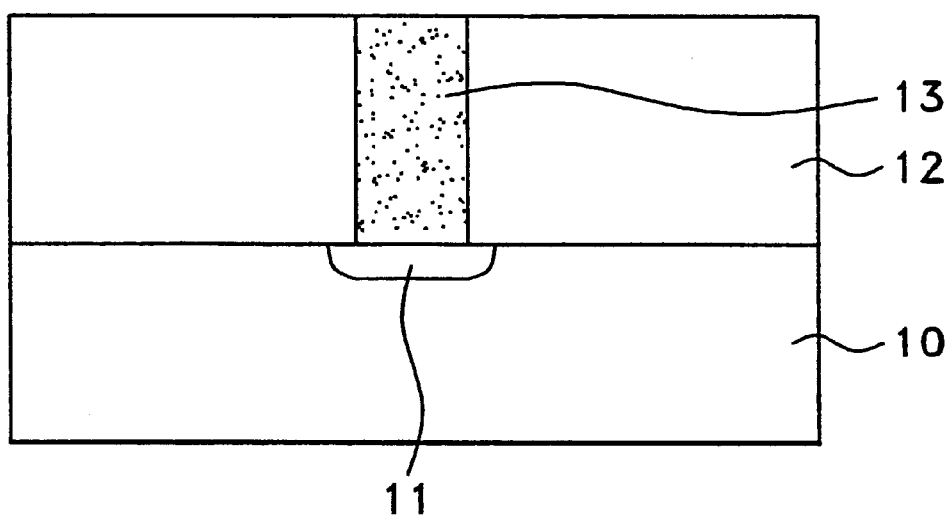
FIGS. 1 to 6 are sectional views showing a method for fabricating ferroelectric memory device according to the present invention.

FIGS. 1 to 6 are sectional views showing a method for fabricating ferroelectric memory device according to the present invention. First, as shown in FIG. 1, an intermetal insulating layer 12 is formed on a silicon substrate 10 having a junction region 11. A selected portion of the intermetal insulating layer 12 is etched to expose the junction region 11 thereby forming a contact hole. A polysilicon layer is formed on the intermetal insulating layer 12 according to a chemical vapor deposition (CVD) so that the contact hole is buried. Entire surface of the polysilicon layer is etched to expose a surface of the intermetal insulating layer 12 thereby forming a contact plug 13 within the contact hole.

Figure 2:
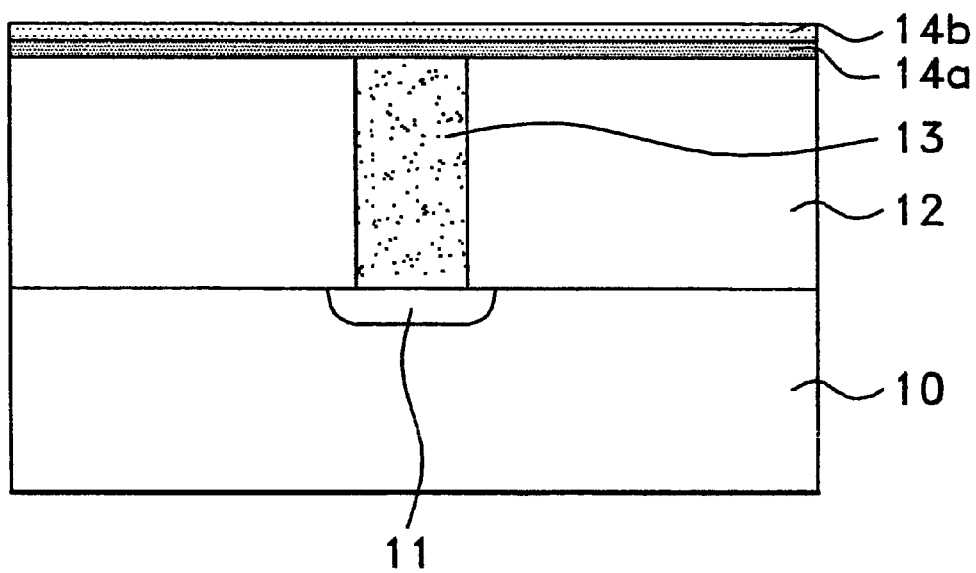

Referring to FIG. 2, a first and a second barrier layers 14a and 14b are deposited in series on the intermetal insulating layer 12 according to the CVD method or a sputtering method. The first barrier layer 14a is selectively made of a Ti layer or a Ta layer with thickness of 100~1000 Å. The second barrier layer 14b is selectively made of a TiSi₄ layer or a TiN layer with thickness of approximately 200~1000 Å.

Figure 3:
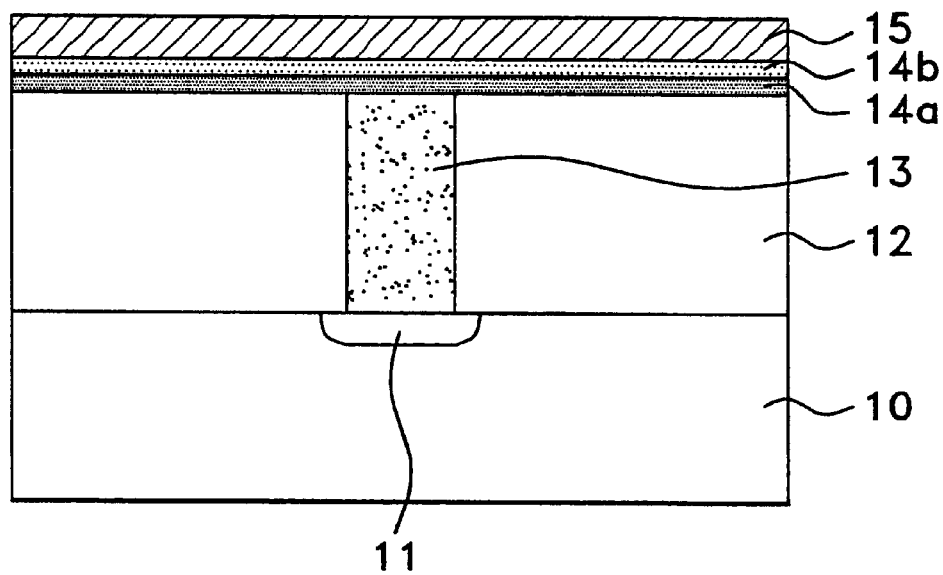

As shown in FIG. 3, a first metal layer 15 such as tungsten (W), tungsten nitride(WN), tantalum(Ta), tantalum nitride (TaN) and titanium nitride (TiN) is formed on the second barrier layer 14b. The first metal layer 15 is deposited by thickness of 2000~15000 Å.

Figure 4:
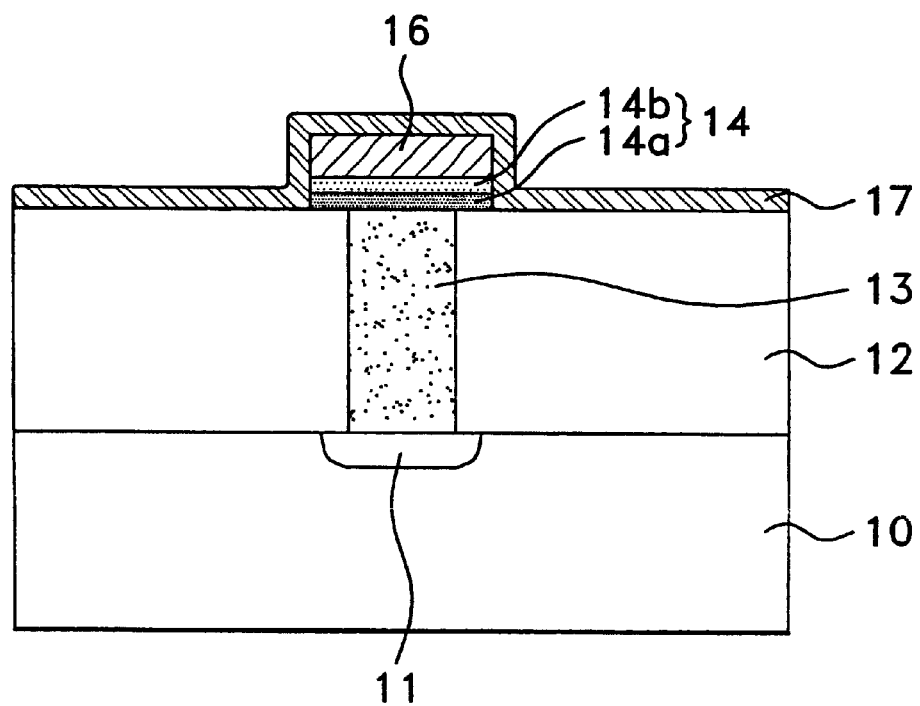

Next, referring to FIG. 4, a lower metal layer 15, the first and the second barrier layers 14a, 14b are etched to contact with the contact plug 13 thereby forming a storage node electrode 16. A ferroelectric layer 17, for example a BST layer is deposited on the intermetal insulating layer 12 on which the storage node electrode 16 is formed. And then, the BST layer is deposited on the entire resultant structure. At this time, the ferroelectric layer 17 is formed with thickness of approximately 100~500 Å at temperature of 100~400° C. that the storage node electrode 16 is not oxidized. Since the deposited ferroelectric layer 17 is formed at the temperature below 400° C., the ferroelectric layer 17 has amorphous structure. As the ferroelectric layer 17 has the amorphous structure, there is not formed any native oxide layer at an interface between the ferroelectric layer and the storage node electrode 16.

Figure 5:
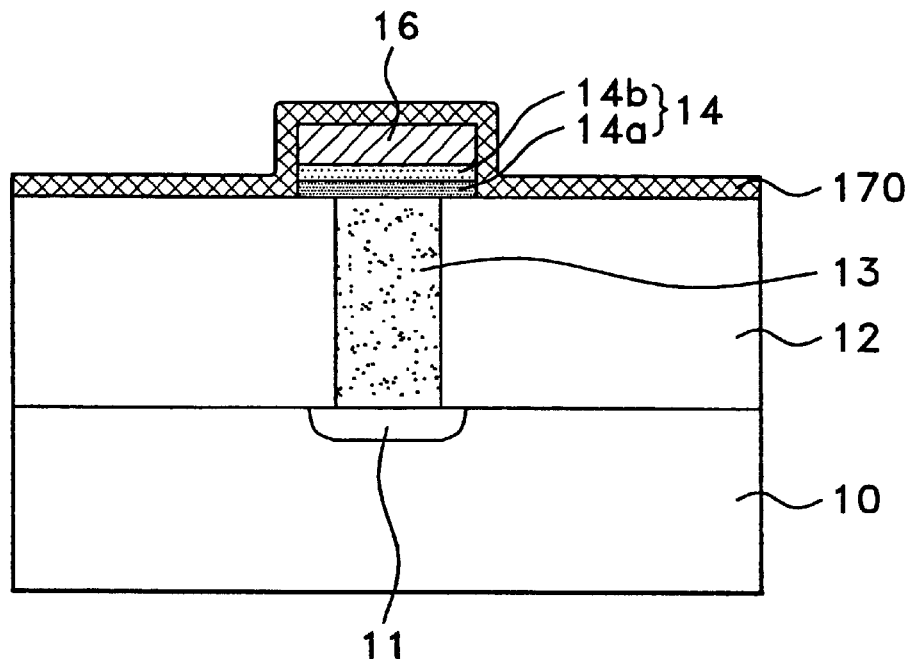

Continuously, as shown in FIG. 5, in order to crystallize the deposited amorphous ferroelectric layer 17, the rapid thermal annealing process is performed under hydrogen atmosphere at temperature of 400~800° C. for 1~30 minutes. Or a furnace annealing process is performed under the same process condition for 10~100 minutes. Afterward, the resultant structure on the semiconductor substrate is processed at temperature of 200~400° C. by oxynitride or oxygen plasma treatment or UV-O₃ treatment for 1~30 minutes so as to remove impurities, e.g. carbon diffused from the ferroelectric layer 17 during depositing the ferroelectric layer 17, also to prevent oxygen discrepancy during annealing process.

Figure 6:
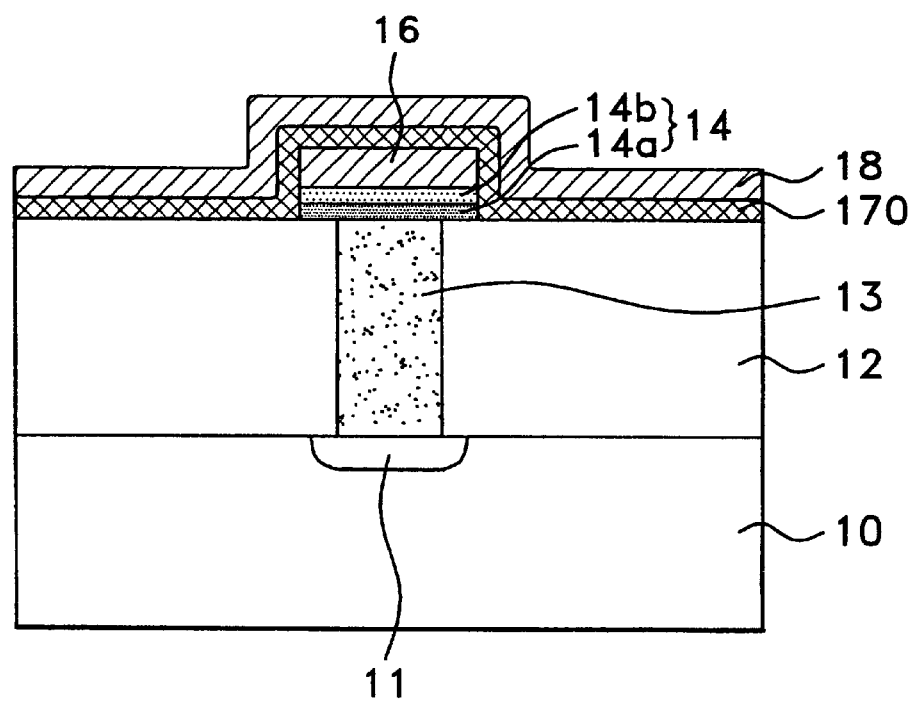

Next, as shown in FIG. 6, a second metal layer 18 for plate electrode of capacitor is deposited on the ferroelectric layer 17. Herein, the second metal layer 18 is selected from tungsten(W), tungsten nitride(WN), tantalum(Ta), tantalum nitride(TaN) and titanium nitride (TiN). Then, the resultant is annealed by the rapid thermal process or the furnace so as to prevent interface leakage current.

According to the present invention as described above, the ferroelectric layer is deposited at temperature of 100~400° C. that general metal layers such as tungsten(W), tungsten nitride(WN), tantalum(Ta), tantalum nitride(TaN), titanium(Ti) and titanium nitride(TiN) are not oxidized. Thus, during depositing the ferroelectric layer, surface of the general metal layer is not oxidized. Accordingly, the general metal layer that is cheap and has excellent etching characteristic can be used as an electrode of ferroelectric capacitor. Further, the ferroelectric layer is deposited at low temperature, it has amorphous structure during depositing process. When this amorphous ferroelectric layer is crystallized, a formation of oxide layer at an interface between the ferroelectric layer and a storage node electrode is prevented. Therefore, thickness of a dielectric is not increased any more, capacitance is increased and leakage current is also increased.

While the present invention has been described with reference to certain preferred embodiment, various other modifications will be apparent to and can be readily made by those skilled in the art without departing from the scope and spirit of the present invention.

What is claimed is:

1. A method for fabricating a ferroelectric memory device comprising the steps of:

forming an intermetal insulating layer provided with a contact hole exposing a junction region formed on a semiconductor layer having the junction region;

forming a contact plug within the contact hole;

forming successively a barrier layer and a metal layer for storage node electrode on the intermetal insulating layer:

forming a storage node electrode by patterning the metal layer for storage node electrode and the barrier layer to be contact with the contact plug;

depositing a ferroelectric layer on a semiconductor substrate in which a lower electrode is formed, the ferroelectric layer is deposited at a temperature that the storage node electrode is not oxidized;

crystallizing the ferroelectric layer;

heat-treating the crystallized ferroelectric layer, the crystallized ferroelectric layer is performed by oxynitride or oxygen plasma treatment for 1~30 minutes so as to remove impurities diffused from the ferroelectric layer during depositing the ferroelectric layer and so as to prevent oxygen discrepancy caused by the nitrogen; and forming a plate electrode on the ferroelectric layer.

2. The method of claim 1, wherein the storage node electrode is selected from a group consisting of tungsten (W), tungsten nitride (WN), tantalum (Ta), tantalum nitride (TaN), titanium (Ti), and Titanium nitride (TiN).

3. The method of claim 2, wherein the ferroelectric layer is deposited at temperature of 100~400° C. according to a metal-organic chemical vapor deposition (MOCVD) method.

4. The method of claim 3, wherein the ferroelectric layer is deposited with thickness of 100~500 Å.

5. The method of claim 1, wherein the step of crystallizing the ferroelectric layer is performed under nitrogen atmosphere for 1~30 minutes at temperature of 400~800° C. according to a rapid thermal annealing method.

6. The method of claim 1, wherein the step of crystallizing the ferroelectric layer is performed under nitrogen atmosphere for 1~100 minutes at temperature of 400~800° C. according to a furnace annealing method.

7. A method for fabricating a ferroelectric memory device comprising the steps of:

forming an intermetal insulating layer provided with a contact hole exposing a junction region formed on a semiconductor layer having the junction region;

forming a contact plug within the contact hole;

forming successively a barrier layer and a metal layer for storage node electrode on the intermetal insulating layer:

forming a storage node electrode by patterning the metal layer for storage node electrode and the barrier layer to be contact with the contact plug;

depositing a ferroelectric layer on the storage node electrode and the intermetal insulating layer at a temperature that the storage node electrode is not oxidized;

crystallizing the ferroelectric layer;

heat-treating the crystallized ferroelectric layer, the crystallized ferroelectric layer is performed by UV-O₃ treatment at temperature of 200~400° C. for 1~30 minutes so as to remove impurities flowed into the ferroelectric layer during depositing the ferroelectric layer and so as to prevent oxygen discrepancy caused by the nitrogen; and forming a plate electrode on the ferroelectric layer, wherein the storage node electrode is selected from a group consisting of tungsten (W), tungsten nitride (WN), tantalum (Ta), tantalum nitride (TaN), titanium (Ti), and Titanium nitride (TiN.), wherein the ferroelectric layer is deposited at temperature of 100~400° C. according to the MOCVD method.

8. The method of claim 7, where in the step of crystallizing the ferroelectric layer is performed under nitrogen atmosphere for 10~30 minutes according to a rapid thermal annealing method.

9. The method of claim 7, wherein the step of crystallizing the ferroelectric layer is performed under nitrogen atmosphere for 10~100 minutes according to a furnace annealing method.

* * * * *